United States Patent
Wang et al.

(10) Patent No.: US 11,404,545 B2
(45) Date of Patent: Aug. 2, 2022

(54) METHOD OF FORMING SPLIT-GATE FLASH MEMORY CELL WITH SPACER DEFINED FLOATING GATE AND DISCRETELY FORMED POLYSILICON GATES

(71) Applicant: Silicon Storage Technology, Inc., San José, CA (US)

(72) Inventors: Chunming Wang, Shanghai (CN); Xian Liu, Sunnyvale, CA (US); Nhan Do, Saratoga, CA (US); Leo Xing, Shanghai (CN); Guo Yong Liu, Shanghai (CN); Melvin Diao, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/796,412

(22) Filed: Feb. 20, 2020

(65) Prior Publication Data
US 2021/0005724 A1 Jan. 7, 2021

(30) Foreign Application Priority Data
Jul. 4, 2019 (CN) .......................... 201910598339.9

(51) Int. Cl.
*H01L 21/28* (2006.01)
*H01L 29/66* (2006.01)
(Continued)

(52) U.S. Cl.
CPC .. *H01L 29/40114* (2019.08); *H01L 27/11521* (2013.01); *H01L 21/3212* (2013.01); *H01L 21/32139* (2013.01)

(58) Field of Classification Search
CPC ........ H01L 29/40114; H01L 27/11521; H01L 21/32139; H01L 21/3212; H01L 29/42328; H01L 29/66825; H01L 29/7885
See application file for complete search history.

(56) References Cited

U.S. PATENT DOCUMENTS

| | | |
|---|---|---|
| 5,029,130 A | 7/1991 | Yeh |
| 5,856,943 A | 1/1999 | Jeng |

(Continued)

FOREIGN PATENT DOCUMENTS

| | | |
|---|---|---|
| TW | 202002241 | 1/2020 |
| TW | 202018917 | 5/2020 |
| WO | 2017 184315 | 10/2017 |

*Primary Examiner* — David Vu
(74) *Attorney, Agent, or Firm* — DLA Piper LLP (US)

(57) ABSTRACT

A method of forming a memory device that includes forming a first polysilicon layer using a first polysilicon deposition over a semiconductor substrate, forming an insulation spacer on the first polysilicon layer, and removing some of the first polysilicon layer to leave a first polysilicon block under the insulation spacer. A source region is formed in the substrate adjacent a first side surface of the first polysilicon block. A second polysilicon layer is formed using a second polysilicon deposition. The second polysilicon layer is partially removed to leave a second polysilicon block over the substrate and adjacent to a second side surface of the first polysilicon block. A third polysilicon layer is formed using a third polysilicon deposition. The third polysilicon layer is partially removed to leave a third polysilicon block over the source region. A drain region is formed in the substrate adjacent to the second polysilicon block.

12 Claims, 24 Drawing Sheets

(51) Int. Cl.
*H01L 29/423* (2006.01)
*H01L 27/11521* (2017.01)
*H01L 21/3213* (2006.01)
*H01L 21/321* (2006.01)

(56) References Cited

U.S. PATENT DOCUMENTS

| | | |
|---|---|---|
| 6,747,310 B2 | 6/2004 | Fan et al. |
| 6,855,980 B2 | 2/2005 | Wang et al. |
| 6,952,034 B2 | 10/2005 | Hu et al. |
| 7,315,056 B2 | 1/2008 | Klinger |
| 7,868,375 B2 | 1/2011 | Liu et al. |
| 7,927,994 B1 | 4/2011 | Liu et al. |
| 8,975,131 B2 | 3/2015 | Do et al. |
| 9,190,532 B2 * | 11/2015 | Wang ................ H01L 29/42328 |
| 9,245,638 B2 | 1/2016 | Do et al. |
| 9,570,592 B2 | 2/2017 | Do et al. |
| 9,583,640 B1 | 2/2017 | Ralf |
| 9,721,958 B2 | 8/2017 | Yang et al. |
| 10,141,321 B2 | 11/2018 | Chen et al. |
| 10,418,451 B1 | 9/2019 | Do et al. |
| 2008/0099789 A1 | 5/2008 | Kotov et al. |
| 2012/0028424 A1* | 2/2012 | Shimizu ............ H01L 27/11521 |
| | | 438/257 |
| 2013/0313626 A1 | 11/2013 | Huang et al. |
| 2014/0091382 A1 | 4/2014 | Tadayoni et al. |
| 2015/0200292 A1* | 7/2015 | Chang ................ H01L 27/11521 |
| | | 257/316 |
| 2015/0213898 A1 | 7/2015 | Do et al. |
| 2016/0064394 A1 | 3/2016 | Chen-Liang |
| 2016/0141296 A1 | 5/2016 | Jianbo |
| 2016/0336415 A1 | 11/2016 | Wu et al. |
| 2017/0040334 A1 | 2/2017 | Cheng et al. |

\* cited by examiner

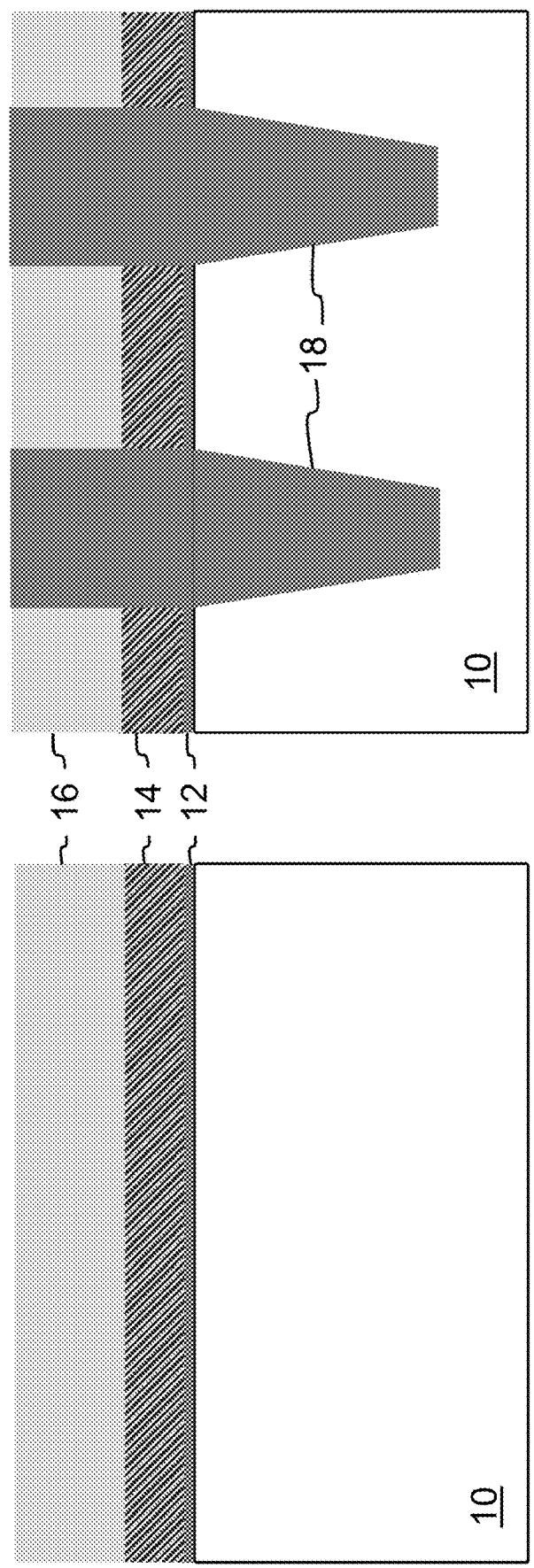

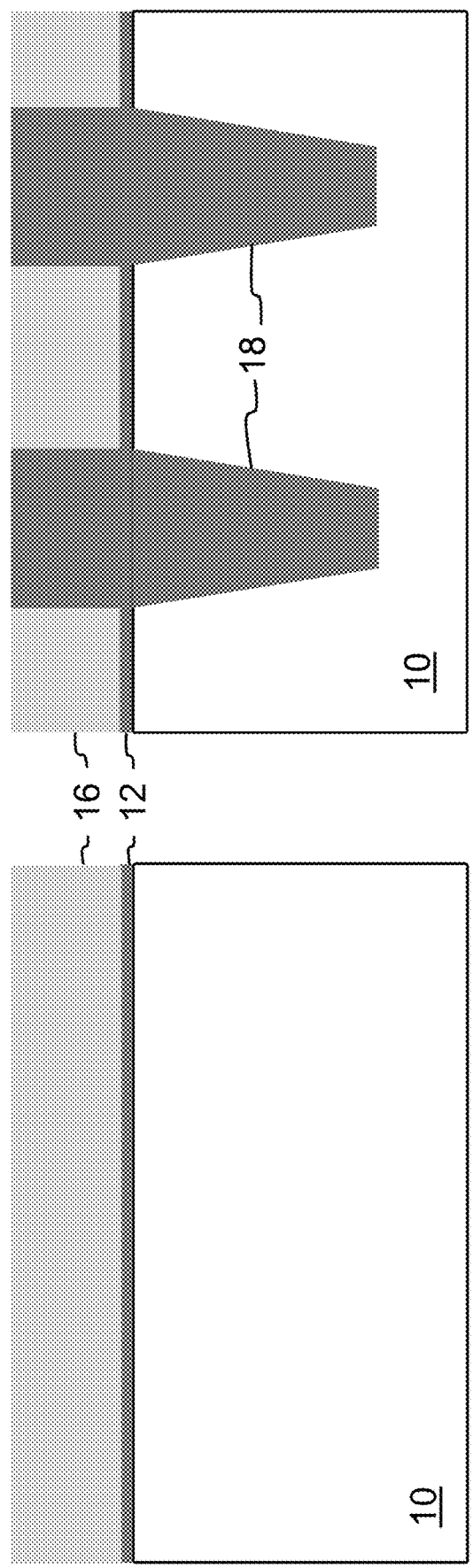

METHOD OF FORMING SPLIT-GATE FLASH MEMORY CELL WITH SPACER DEFINED FLOATING GATE AND DISCRETELY FORMED POLYSILICON GATES

RELATED APPLICATION

This application claims the benefit of Chinese Patent Application No. 201910598339.9, as filed on Jul. 4, 2019, entitled "Method Of Forming Split-Gate Flash Memory Cell With Spacer Defined Floating Gate And Discretely Formed Polysilicon Gates."

FIELD OF THE INVENTION

The present invention relates to split gate non-volatile memory cells

BACKGROUND OF THE INVENTION

Split gate non-volatile memory cells with three gates are known. See for example U.S. Pat. No. 7,315,056, which discloses split gate memory cells each having source and drain regions in a semiconductor substrate with a channel region extending there between, a floating gate over a first portion of the channel region, a control gate (also called a word line gate) over a second portion of the channel region, and a program/erase (P/E) gate over the source region.

Fabrication method improvements are needed to better control the formation of various elements of the memory cells.

BRIEF SUMMARY OF THE INVENTION

The aforementioned problems and needs are addressed a method of forming a memory device that includes:

forming a first polysilicon layer using a first polysilicon deposition over and insulated from a semiconductor substrate;

forming an insulation spacer on the first polysilicon layer;

removing some of the first polysilicon layer so as to leave a block of the first polysilicon layer under the insulation spacer, wherein the block of the first polysilicon layer has opposing first and second side surfaces;

forming a source region in the substrate adjacent the first side surface;

forming a second polysilicon layer using a second polysilicon deposition over the substrate;

removing some of the second polysilicon layer so as to leave a block of the second polysilicon layer that is over and insulated from the substrate, and adjacent to and insulated from the second side surface;

forming a third polysilicon layer using a third polysilicon deposition over the substrate;

removing some of the third polysilicon layer so as to leave a block of the third polysilicon layer that is over and insulated from the source region; and forming a drain region in the substrate adjacent to the block of the second polysilicon layer.

Other objects and features of the present invention will become apparent by a review of the specification, claims and appended figures.

BRIEF DESCRIPTION OF THE DRAWINGS

FIGS. 1A-1C are side cross sectional views showing the steps in forming the isolation regions.

FIGS. 3A-3C are side cross sectional views showing the steps of an alternate embodiment for forming the isolation regions.

DETAILED DESCRIPTION OF THE INVENTION

The present invention is an improved method of forming non-volatile split gate memory cells having three gates per memory cell. While the figures show only a pair of memory cells being formed, it should be appreciated that an array of such memory cells are formed during the process. The process begins by first forming isolation regions, starting with forming an insulation layer 12 such as silicon dioxide (also referred to herein as "oxide") on the upper surface of a semiconductor substrate 10. A conductive layer 14 such as polysilicon (also referred to herein as "poly") is formed on oxide layer 12. An insulation layer 16 such as silicon nitride (also referred to herein as "nitride") is formed on poly layer 14. These layers are shown in FIG. 1A.

Figure 1C:
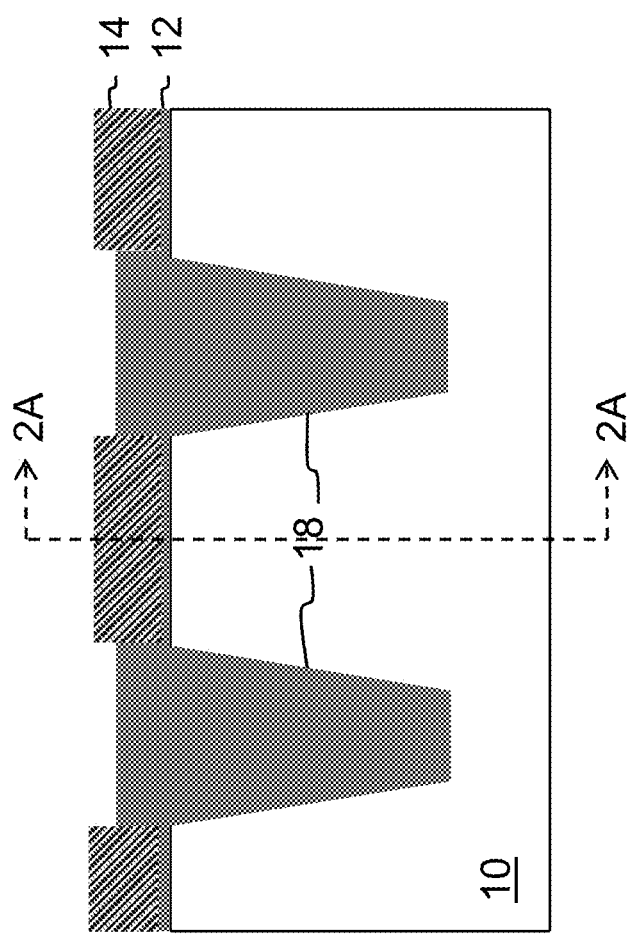

Photoresist is formed over the structure and patterned using a photolithography (masking) process (i.e., photoresist formation, selective exposure of the photoresist, removal of selective portions of the photoresist leaving portions of the underlying material exposed). Here, portions of the nitride layer 16 are left exposed. A series of etches are performed in those areas left exposed by the photoresist, to form trenches that extend through nitride layer 16, poly layer 14, oxide layer 12 and into the substrate 10. The trenches are then filled with insulation material 18 (e.g. oxide) by oxide deposition and by oxide chemical mechanical polish, as shown in FIG. 1B (after photoresist removal). An oxide dry or wet etch polish is used to lower the tops of oxide 18. A nitride etch is then used to remove nitride 16, as shown in FIG. 1C. The tops of oxide 18 are preferably even with or slightly lower than the top surface of poly layer 14. Oxide 18, formed in trenches in this manner, is known in the art as shallow trench isolation (STI), and is used to define columns of active areas of the substrate 10, with adjacent active area columns being insulated from each other by the STI oxide 18.

Figure 2A:
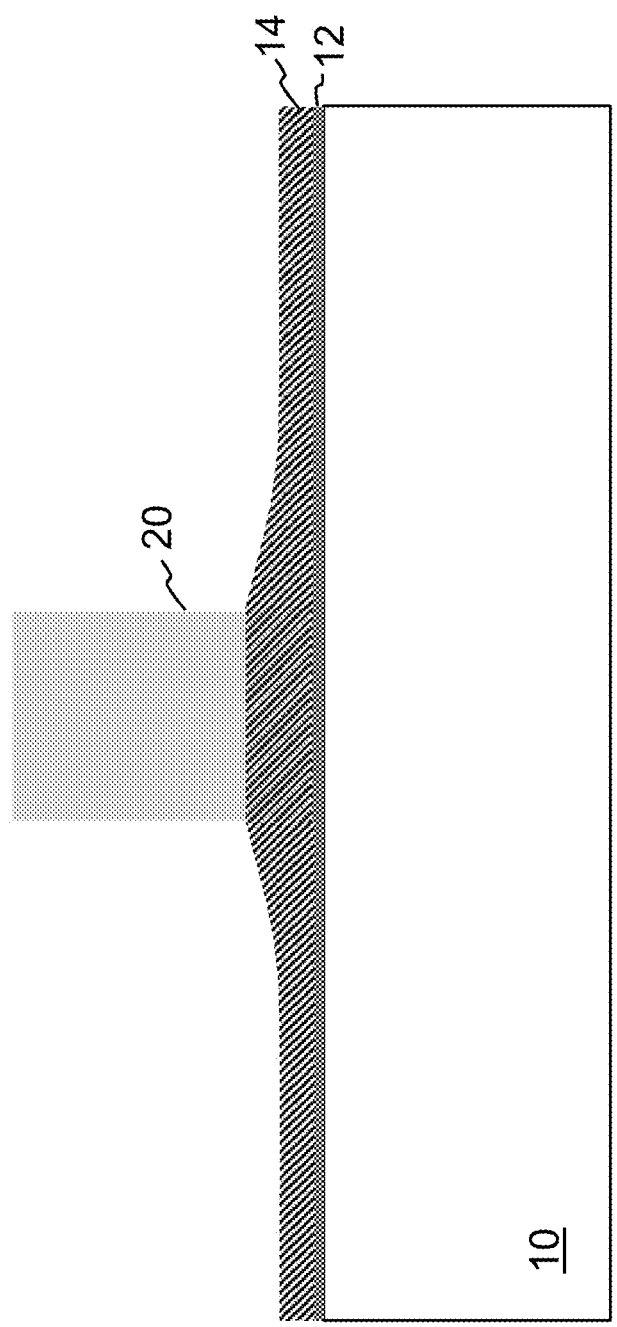
FIGS. 2A-2E are side cross sectional views showing the steps in forming the memory cells.

Blocks of insulation material 20 (e.g. nitride) are formed on the poly layer 14 in each of the active regions. Each block 20 (to be used to form a pair of memory cells) can be formed, for example, by forming a layer of nitride on poly layer 14, and performing a masking step to selectively cover portions the nitride layer with photoresist while leaving other portions exposed, and removing the exposed portions of the nitride layer using an anisotropic nitride etch, leaving blocks 20 on poly layer 14. A polysilicon sloped etch is then used to etch the upper surface of poly layer 14, creating a sloped upper surface for the poly layer 14 where the upper surface slopes upwardly as it approaches each block of nitride 20. If desired, to control the floating gate threshold voltage, an implantation can then performed on the exposed portions of the poly layer 14. The resulting structure for one of the nitride blocks is shown in FIG. 2A, which is a partial cross sectional view of one of the active regions (i.e. an orthogonal cross sectional view to that of FIGS. 1A-1C).

Figure 2B:
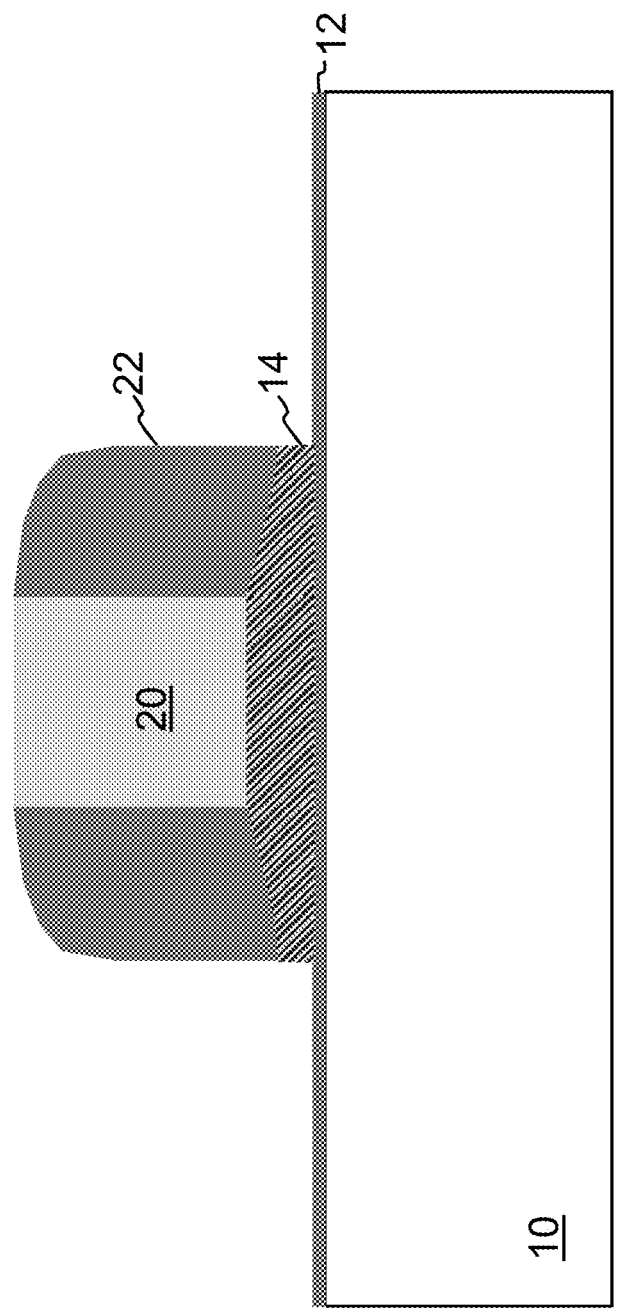

Insulation spacers 22 (e.g., formed of oxide) are formed on the poly layer 14. Formation of spacers is well known, and involves the deposition of material followed by an anisotropic etch of the material, whereby the material is removed except for portions thereof abutting vertically oriented structures. The upper surface of the spacer is typically rounded. In this case, oxide is deposited, followed by an anisotropic oxide etch leaving oxide spacers 22 abutting the side walls of nitride block 20. A poly etch is performed to remove the portions of the poly layer 14 not protected by the oxide spacers 22 and nitride block 20, as shown in FIG. 2B. To control the word line threshold voltage, an implant into the portions of the substrate 10 not protected by the nitride block 20 and oxide spacers 22 can be performed at this time (using oxide layer 12 on the substrate surface as a buffer layer).

Figure 2C:
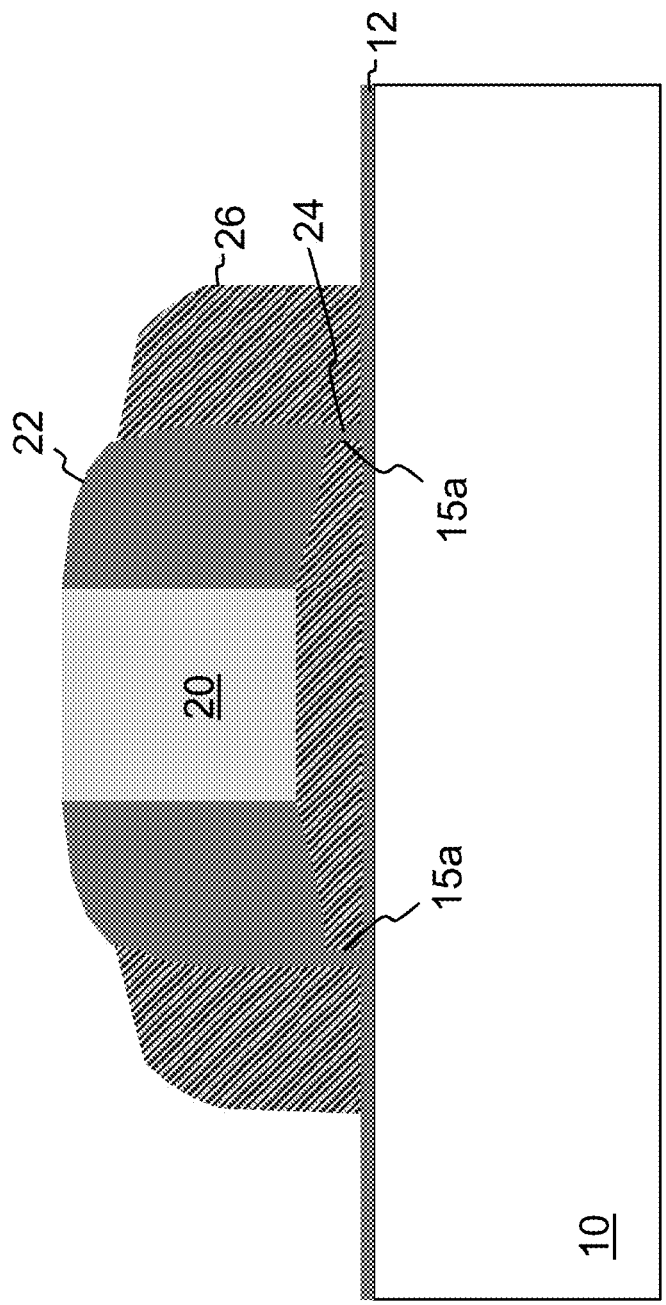

Insulation spacers 24 are formed on the exposed ends of the poly layer 14, which eventually will be the main isolation between the floating gates and word line gates of the finished memory cells. Insulation spacers 24 can be formed of oxide (by performing oxide deposition such as high temperature oxide (HTO) deposition and an anisotropic oxide etch). Insulation spacers 24 could instead be formed of a combination of oxide and nitride (by performing a nitride deposition and etch after the oxide deposition and etch). Insulation spacers 24 on disposed at the first ends (i.e., along first side surfaces 15a) of the poly layer 14. Conductive spacers 26 are then formed on the outer sides of spacers 22/24, preferably by a polysilicon deposition and a polysilicon etch. The formation of conductive spacers 26 can include a buffer oxide deposition and oxide etch after the formation of the poly layer 14 and before the polysilicon spacer etch. The resulting structure is shown in FIG. 2C.

Figure 2D:
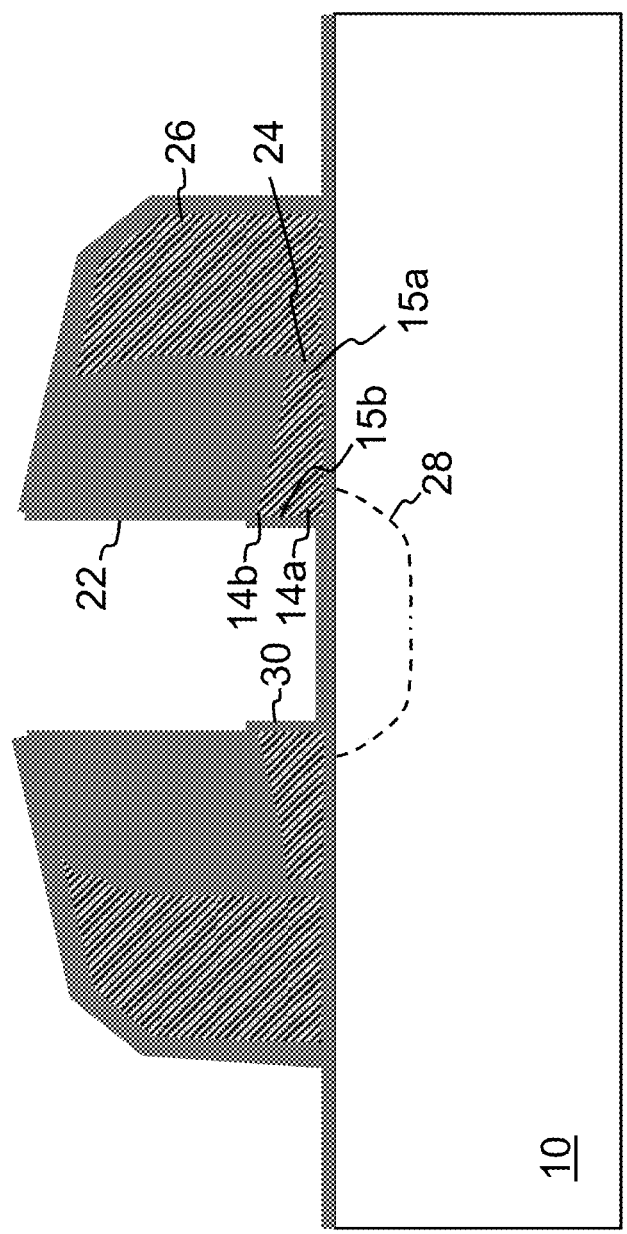

A nitride etch is performed to remove nitride block 20, leaving the portion of poly layer 14 between oxide spacers 22 exposed. A poly etch is then performed to remove that exposed portion of the poly layer 14, leaving distinct poly blocks 14a under the oxide spacers 22. Each poly block 14a has an upwardly sloping upper surface that terminates in a sharp edge 14b at an end of second side surface 15b opposite the first side surface 15a. An implant process follows for forming the source region 28 in the substrate 10 between the oxide spacers 22 and between poly blocks 14a (i.e., the source region 28 is formed under a gap that exists between the oxide spacers 22 and a gap that exists between the poly blocks 14a). An anneal can be performed at this point or later on, which will cause the source region 28 to extend partially under the poly blocks 14a. An oxide layer 30 is then deposited on the structure, including on the exposed ends of the poly blocks 14a adjacent the sharp edges 14b. Oxide layer 30 can be referred to as a tunnel oxide layer, because electrons will tunnel through this layer during the erase operation for the finished memory cells. The resulting structure is shown in FIG. 2D.

A layer of polysilicon is then formed over the structure. This poly layer can be concurrently formed in a logic area of the same substrate (i.e., an area of the same substrate in which logic devices are formed). If it is desirous for the poly layer thickness to be thicker in the memory array area (in which the memory cells) than in the logic area, a cap oxide layer can be formed on the polysilicon layer and patterned to remove the cap oxide layer from the memory area of the device, followed by the deposition of additional polysilicon to thicken the poly layer in the memory area. The additional polysilicon on the cap oxide layer in the logic area can later be removed by a poly chemical mechanical polish (CMP). A poly etch is then performed to remove the poly layer in the memory array area, except for a block 32 of the poly layer disposed between the oxide spacers 22. An implantation is then performed to form drain regions 34 in the substrate adjacent the poly spacers 26, as shown in FIG. 2E.

Figure 2E:
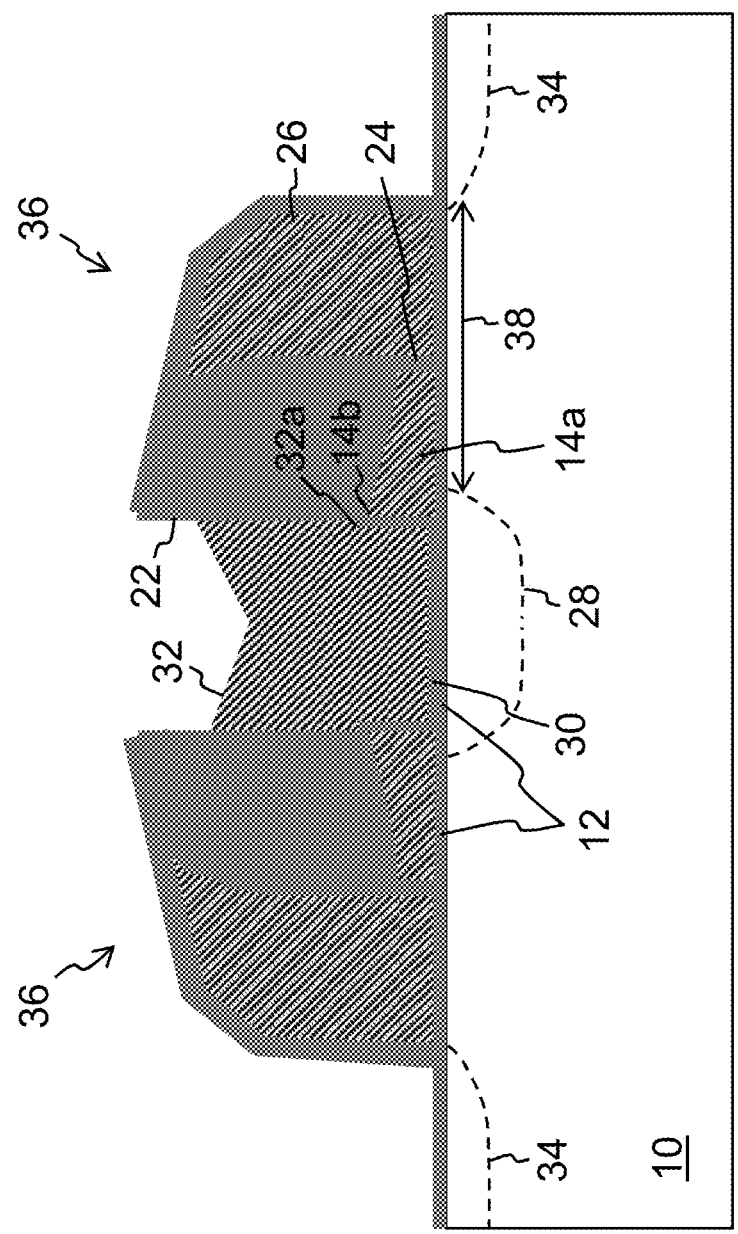

As shown in FIG. 2E, the above described method forms pairs of memory cells 36. Each memory cell pair includes a shared source region 28 and two drain regions 34, with two channel regions 38 each extending between the source region 28 and one of the drain regions 34. An erase gate 32 is disposed over and insulated from the source region 28 by oxide layers 12 and 30. Each memory cell 36 includes a floating gate 14a disposed over and insulated from (and controlling the conductivity of) a first portion of the channel region 38, and a word line gate 26 disposed over and insulated from (and controlling the conductivity of) a second portion of the channel region 38. The floating gate 14a has a sharp tip 14b (resulting from the sloping surface) that faces a notch 32a formed in the erase gate 32. The sharp tip 14b is insulated from the erase gate 32 by the tunnel oxide layer 30. The overall insulation (oxide layers 12 and 30) under erase gate 32 is greater than the overall insulation (oxide layer 12) under floating gate 14a.

Exemplary (non-limiting) operating voltages and current are summarized in Table 1 below, where voltages/current applied to the memory cell being programmed, erased or read (selected-SEL), and voltages applied to other memory cells (unselected-UnSEL), are indicated.

TABLE 1

|  | WL Gate 26 | | Erase Gate 32 | | Source 28 | | Drain 34 | |
| --- | --- | --- | --- | --- | --- | --- | --- | --- |
|  | Sel | UnSel | Sel | UnSel | Sel | UnSel | Sel | UnSel |
| Read | 2.5 V | 0 | 0 | 0 | 0 | 0 | 0.6-1.1 V | 0 |
| Erase | 0 | 0 | 11.5 V | 0 | 0 | 0 | 0 | 0 |
| Program | 1 V | 0 | 4-5 V | 0 | 5-7 | 0 | 1 µA | 0 |

The above described process of forming pairs of memory cells 36 has several advantages. The floating gates 14 are self-aligned to the STI oxide 18, and have dimensions in the channel direction that are defined by oxide spacers 22 (for better control). The word line gates 26 are self-aligned to the floating gates 14a. Each memory cell 36 has three conductive gates (14a, 26, 32), each formed using a different polysilicon layer deposition, so the height of each can be independently optimized. The floating gate 14a has a sharp edge 14b facing the erase gate 32 for enhanced erase performance. The length of each word line gate 26 (in the direction of the channel region) is determined by spacer formation of the gate itself for better dimension control and without requiring a separate masking step. The isolation (oxide or oxide/nitride) between the floating gate 14a and word line gate 26 can be independently optimized by spacer formation. Finally, the tunnel oxide 30 is formed as a single layer wrapping around the sharp tip 14b of the floating gate 14a. Using the above method, erase efficiency and word line gate performance can be independently optimized.

Figure 3C:
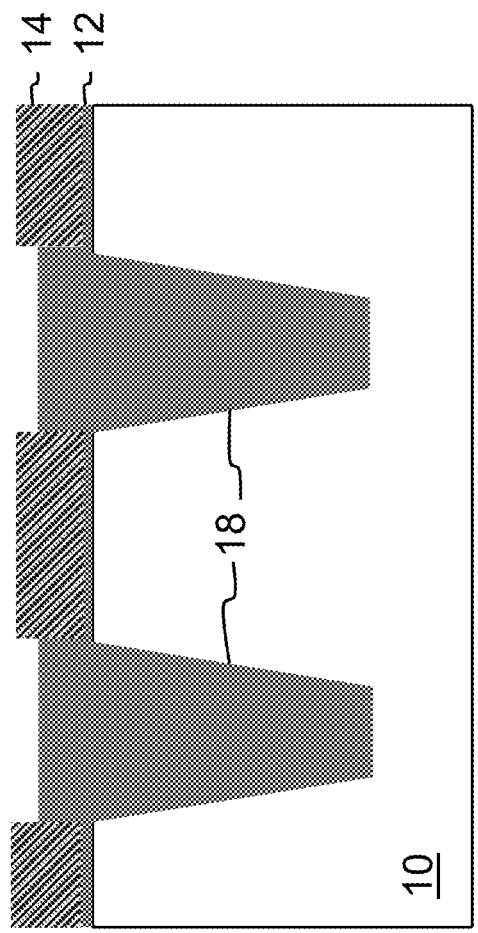

FIGS. 3A-3C illustrate an alternate embodiment for forming the STI oxide 18. The process begins by forming the same layers as shown in FIG. 1A, but without the poly layer 14 between the nitride layer 16 and oxide layer 12, as shown in FIG. 3A. The nitride layer 16 is patterned (photoresist formation, exposure, selective removal, nitride etch), followed by oxide and silicon etches to form trenches that extend through nitride layer 16, oxide layer 12 and into the substrate 10. The trenches are then filled with insulation material 18 (e.g. oxide), as shown in FIG. 3B (after photoresist removal). A nitride etch is used to remove nitride layer 16, and a poly layer 14 is formed on oxide layer 12 between the STI oxide 18 by poly deposition and etch. An oxide etch and/or chemical mechanical polish is used to lower the tops of STI oxide 18 even with, or slightly lower than, the top surface of poly layer 14, as shown in FIG. 3C, which is equivalent to the structure shown in FIG. 1C.

Figure 4A:
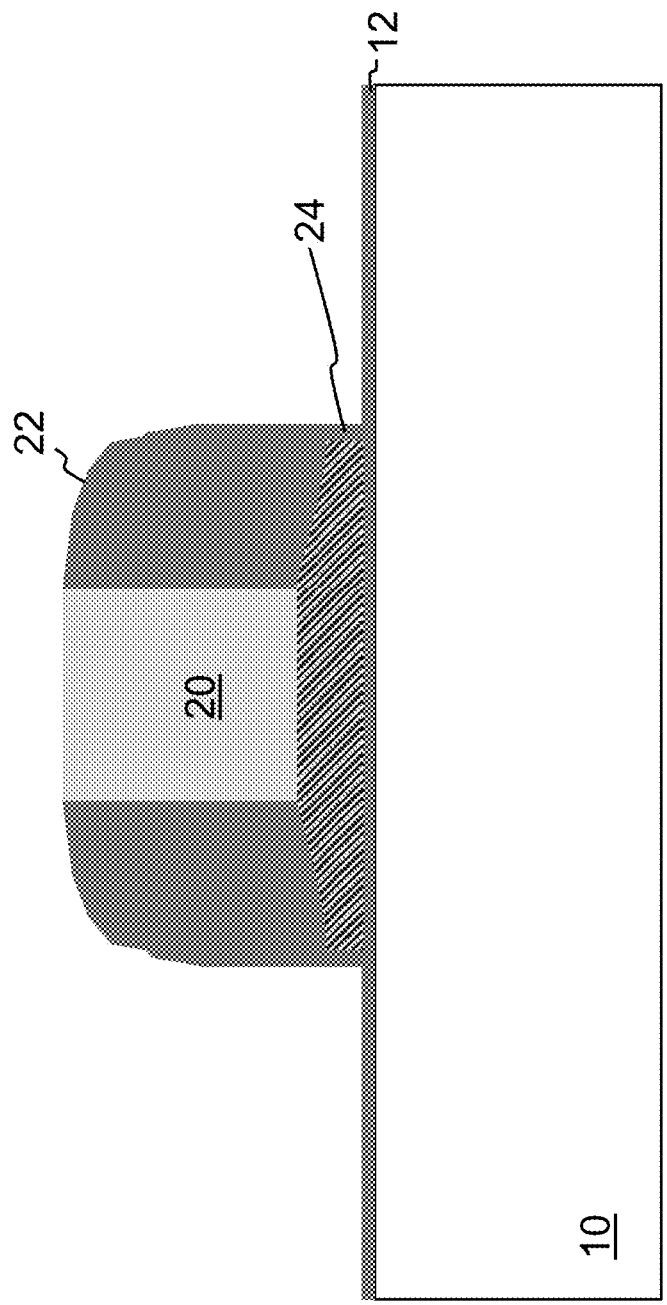
FIGS. 4A-4D are side cross sectional views showing the steps in forming the memory cells according to a first alternate embodiment.
Figure 4B:
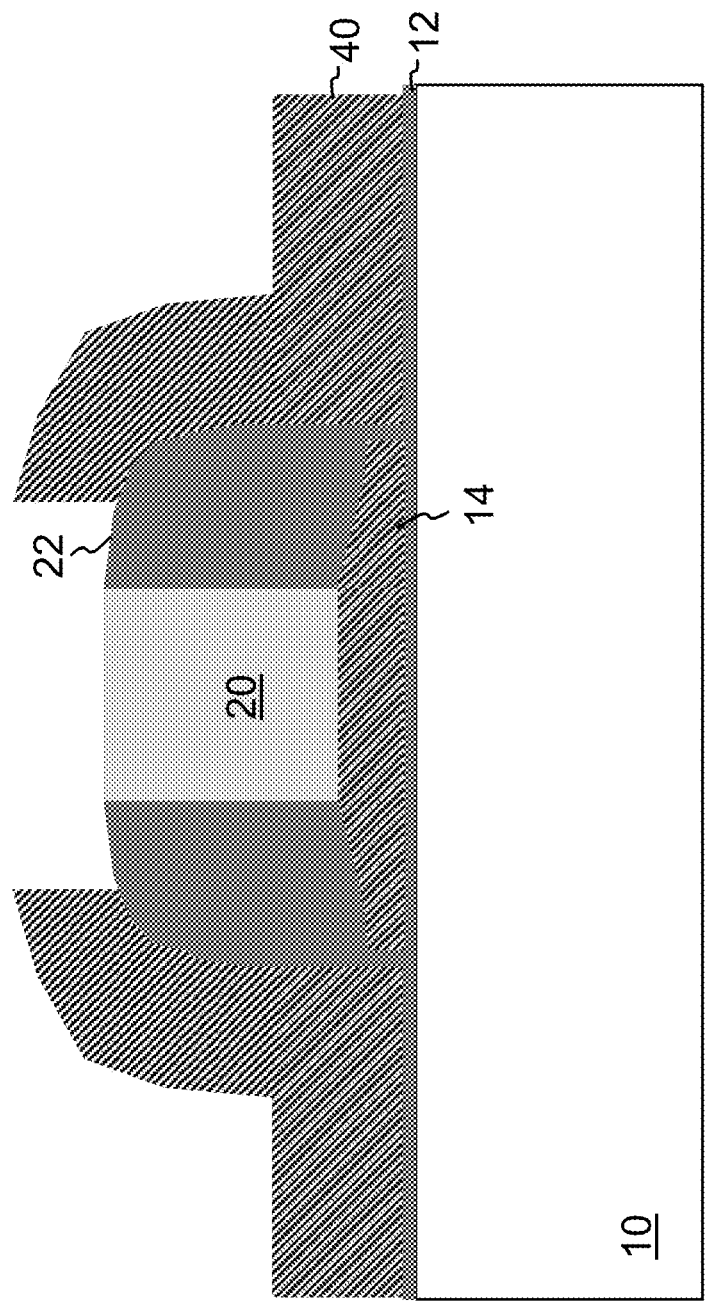
Figure 4C:
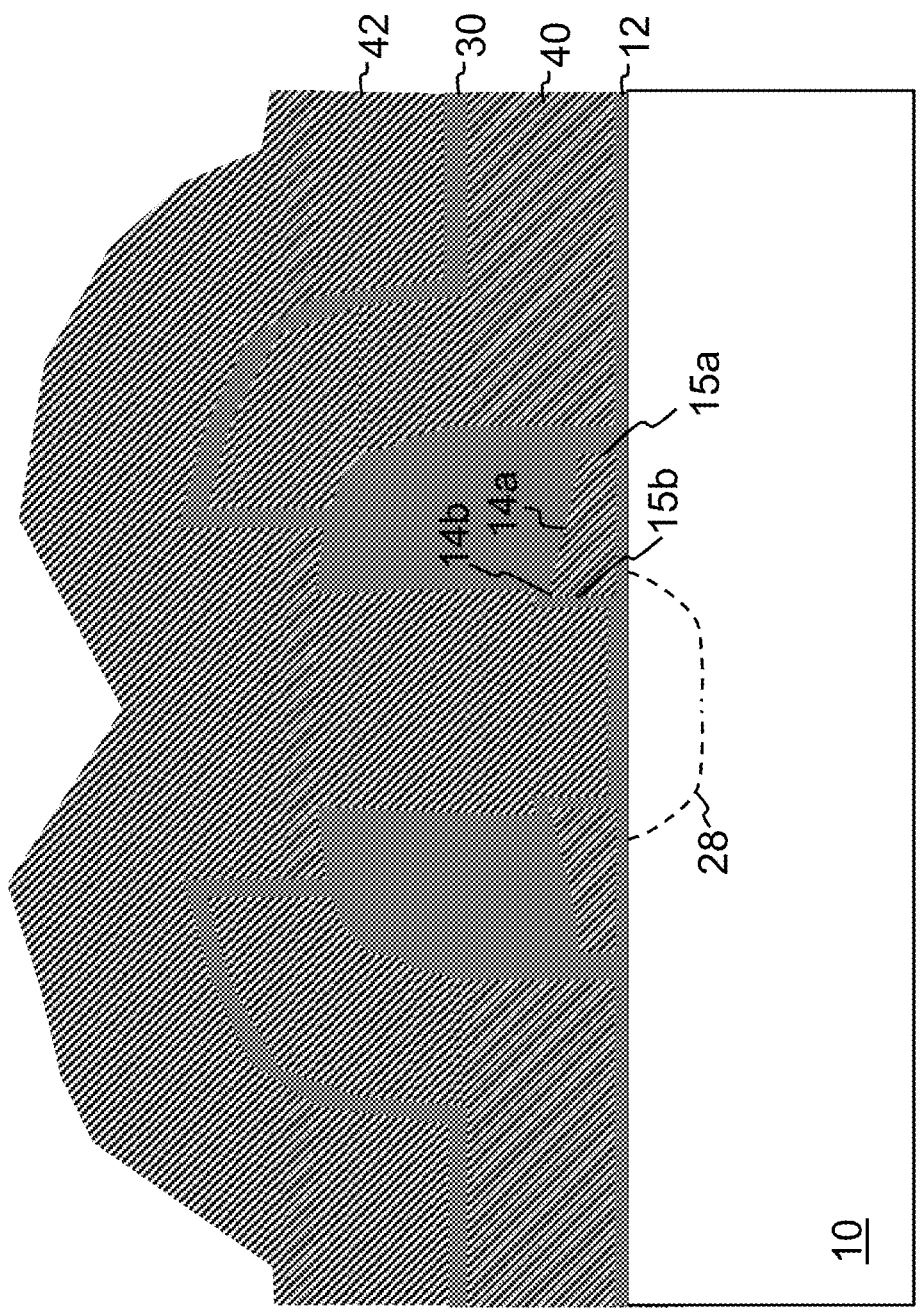
Figure 4D:
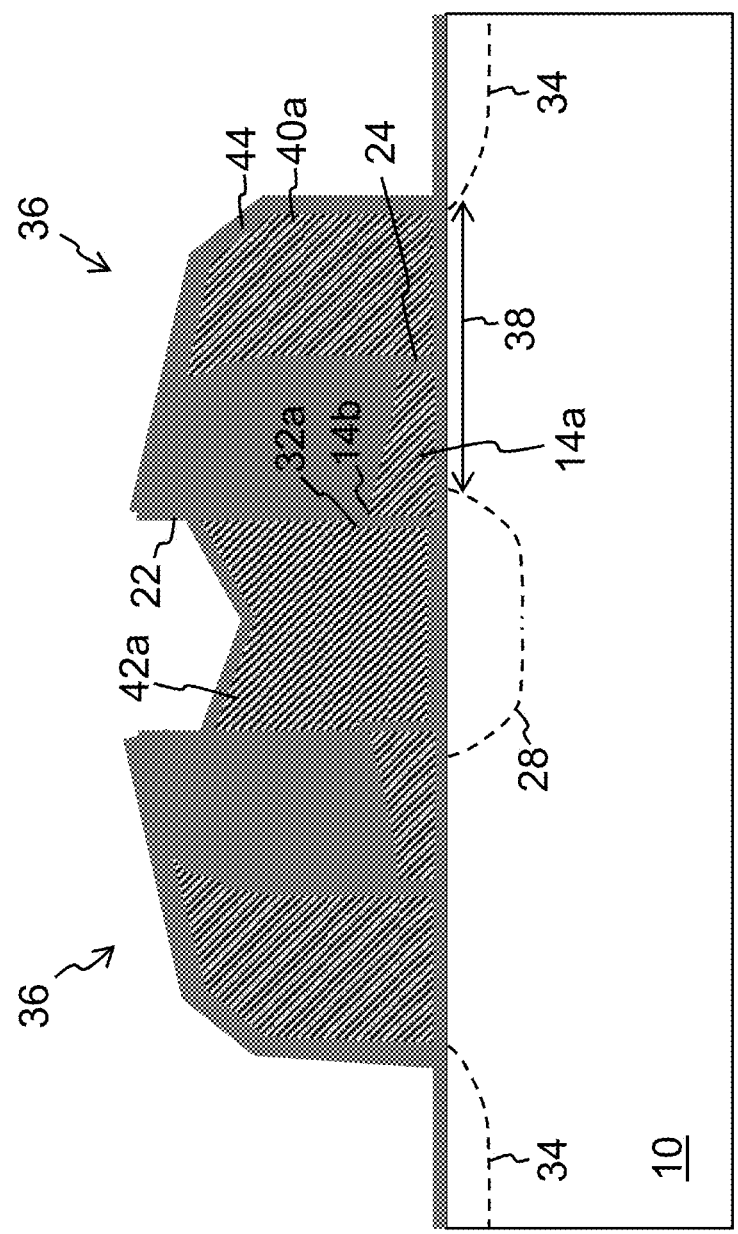

FIGS. 4A-4D illustrate an alternative embodiment for forming memory cells 36, which begins with the same structure of FIG. 2C, except without the formation of poly spacers 26, as shown in FIG. 4A. A layer of polysilicon 40 is formed over the structure. A masked step is performed to cover the poly layer 40 with photoresist except for that portion over the nitride block 20, as well as an additional portion over part of oxide spacers 22 adjacent nitride block 20, which is left exposed. This exposed portion of poly layer 40 is removed by poly etch, as shown in FIG. 4B (after photoresist removal). A nitride etch is then performed to remove nitride block 20, leaving the portion of poly layer 14 between oxide spacers 22 exposed. A poly etch is then performed to remove that exposed portion of the poly layer 14, leaving distinct poly blocks 14a under the oxide spacers 22. An implant process follows for forming the source region 28 in the substrate 10 between the oxide spacers 22 and poly blocks 14a. An anneal can be performed at this point, or later on, which will cause the source region 28 to extend partially under the poly blocks 14a. Oxide layer 30 is then deposited on the structure, including on the exposed ends of the poly blocks 14a adjacent the sharp edges 14b, and on the exposed surfaces of poly layer 40. A layer of polysilicon 42 is then formed over the structure. The resulting structure is shown in FIG. 4C. Polysilicon and oxide etches are then used to remove polysilicon layers 40 and 42, and portions of oxide layer 30, except for poly block 42a as the remaining portion of poly layer 42 between the oxide spacers 22, and poly spacers 40a on the outer sides of spacers 22/24 as the remaining portions of poly layer 40, leaving portions of the substrate exposed for drain implantation. An oxide layer 44 is formed over the structure. An implantation is then performed to form the drain regions 34 in the substrate 10 adjacent the poly spacers 40a. The final structure is shown in FIG. 4D.

Figure 5A:
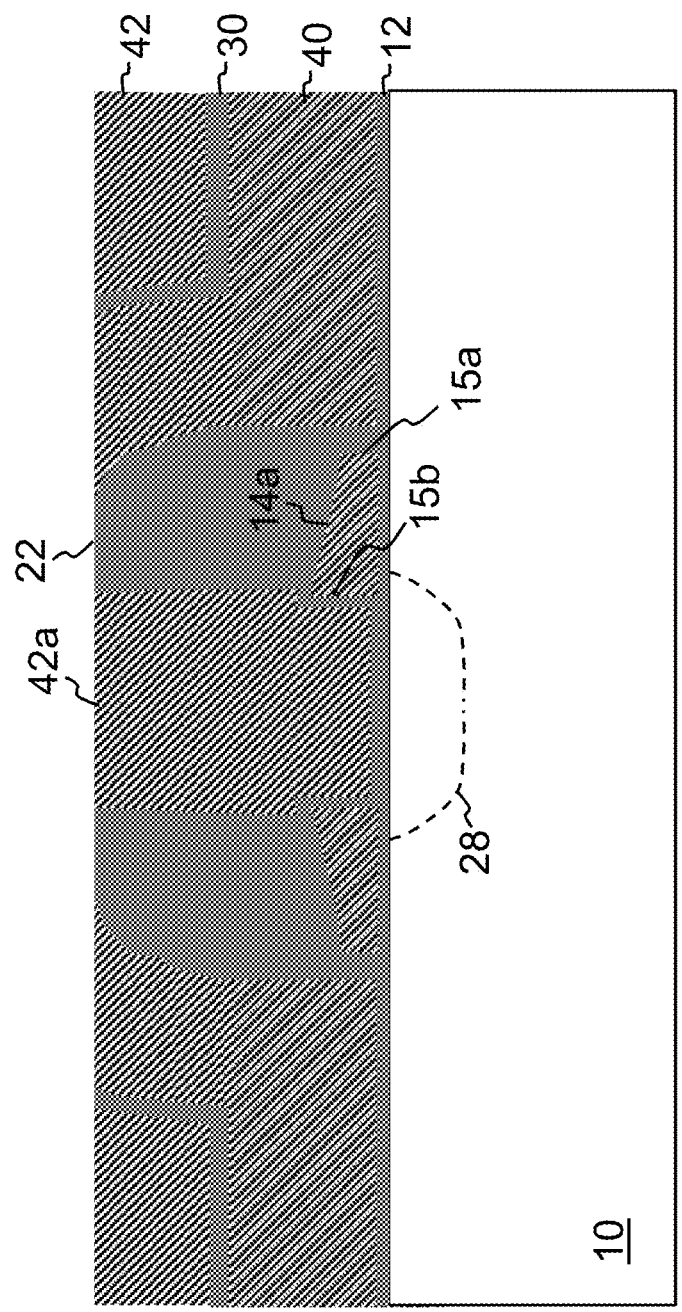
FIGS. 5A-5C are side cross sectional views showing the steps in forming the memory cells according to a second alternate embodiment.
Figure 5B:
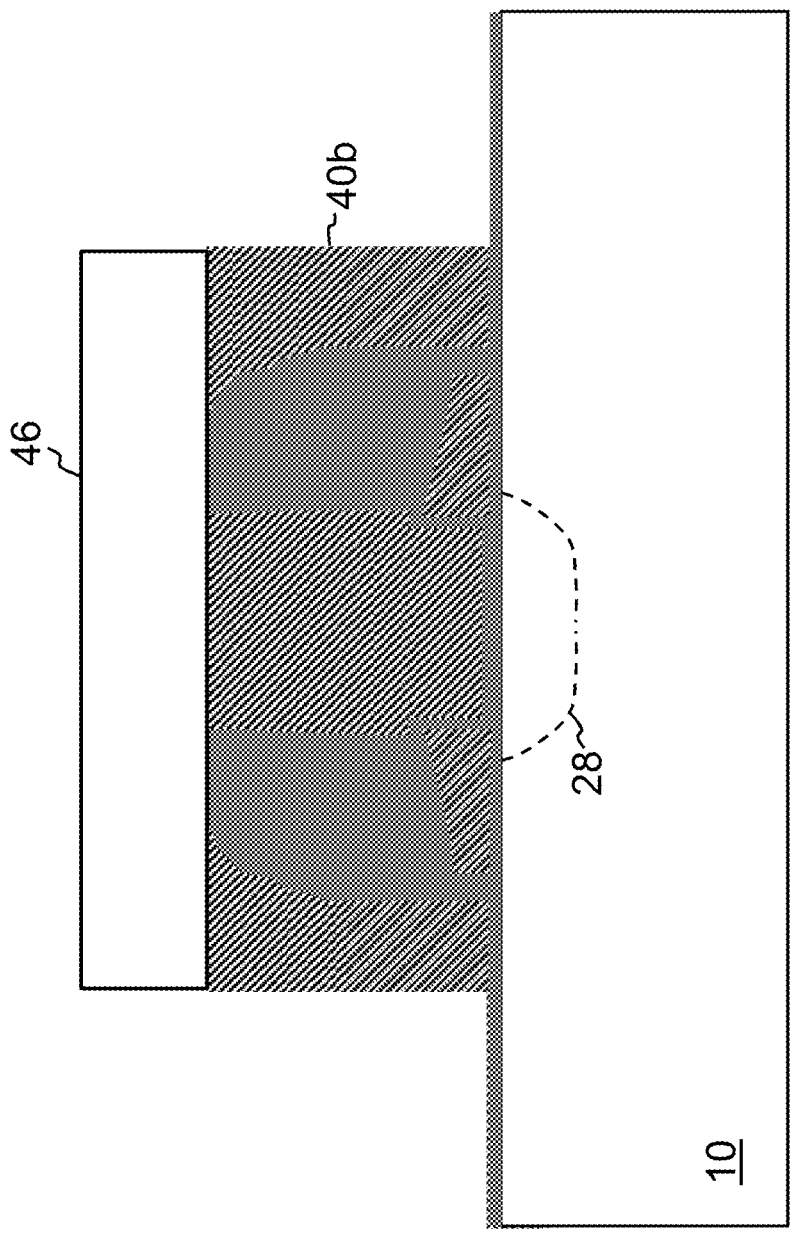
Figure 5C:
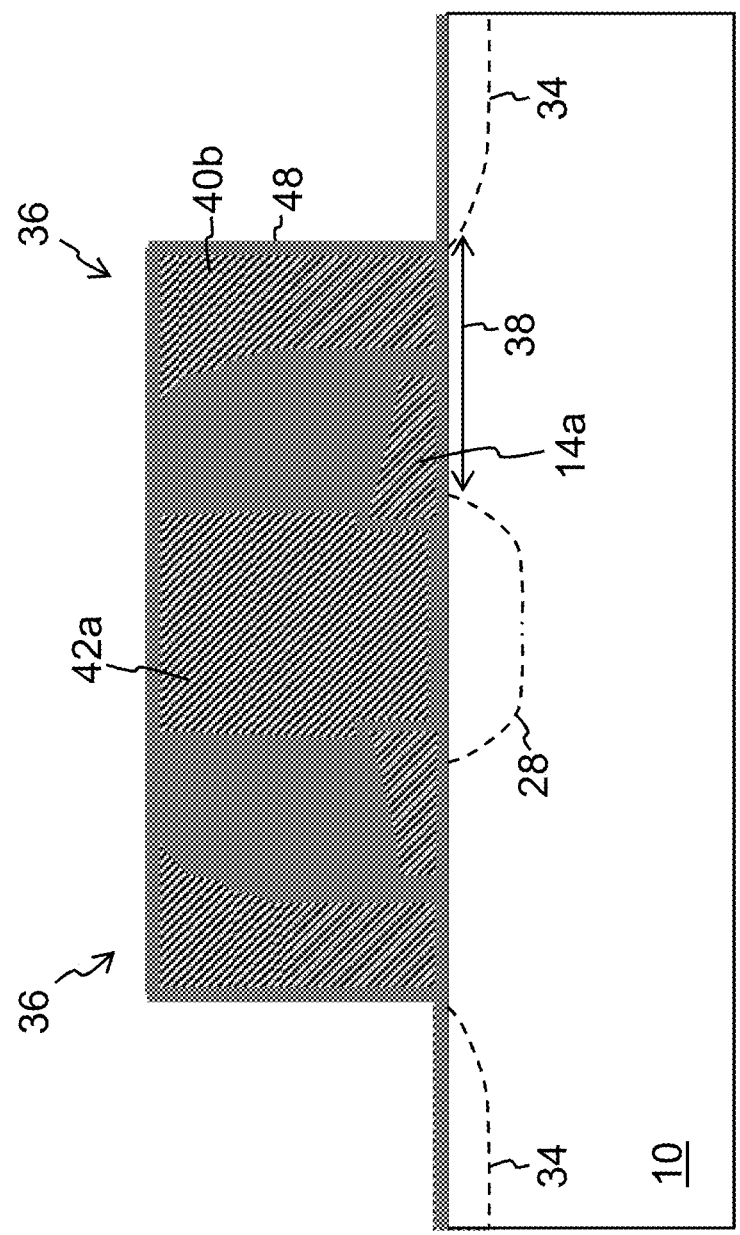

FIGS. 5A-5C illustrate another alternative embodiment for forming memory cells 36, which begins with the structure of FIG. 4C. A chemical mechanical polish (CMP) is used to planarize the top surface of the structure, down to the top surface of oxide spacers 22 (so there is no polysilicon on at least a portion of each oxide spacer 22 thus defining the distinct poly block 42a as the remaining portion of poly layer 42 between oxide spacers 22), as shown FIG. 5A. A masking step is performed to cover the poly block 42a and portions of poly layer 40 with photoresist 46, but leaving the rest of the structure exposed. Poly and oxide etches are performed to remove exposed portions of poly layers 42/40 and oxide layer 30, leaving poly blocks 40b as the remaining portions of poly layer 40 on the outer sides of spacers 22/24, as shown in FIG. 5B. After photoresist removal, an oxide layer 48 is formed over the structure. An implantation is then performed to form the drain regions 34 in the substrate adjacent the poly blocks 40b. The final structure is shown in FIG. 5C. While this embodiment includes an additional masking step, it provides word line gates with lengths in the channel region direction that are defined by the lithography masking process.

Figure 6A:
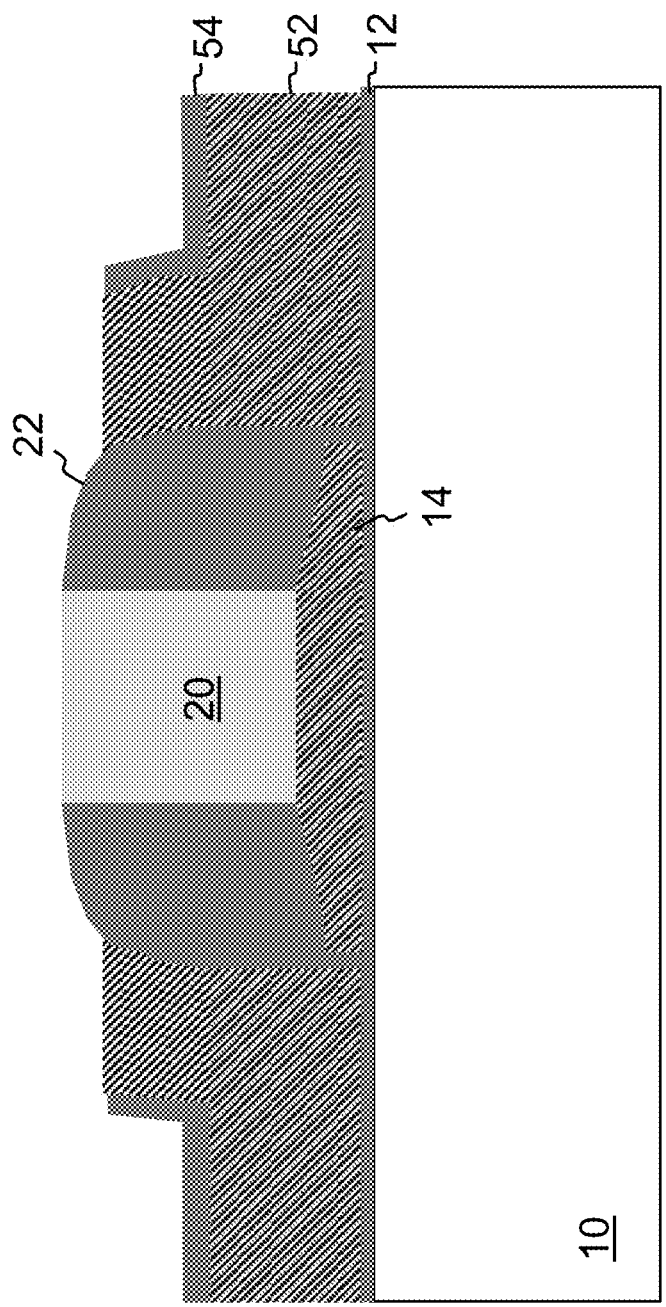
FIGS. 6A-6D are side cross sectional views showing the steps in forming the memory cells according to a third alternate embodiment.
Figure 6B:
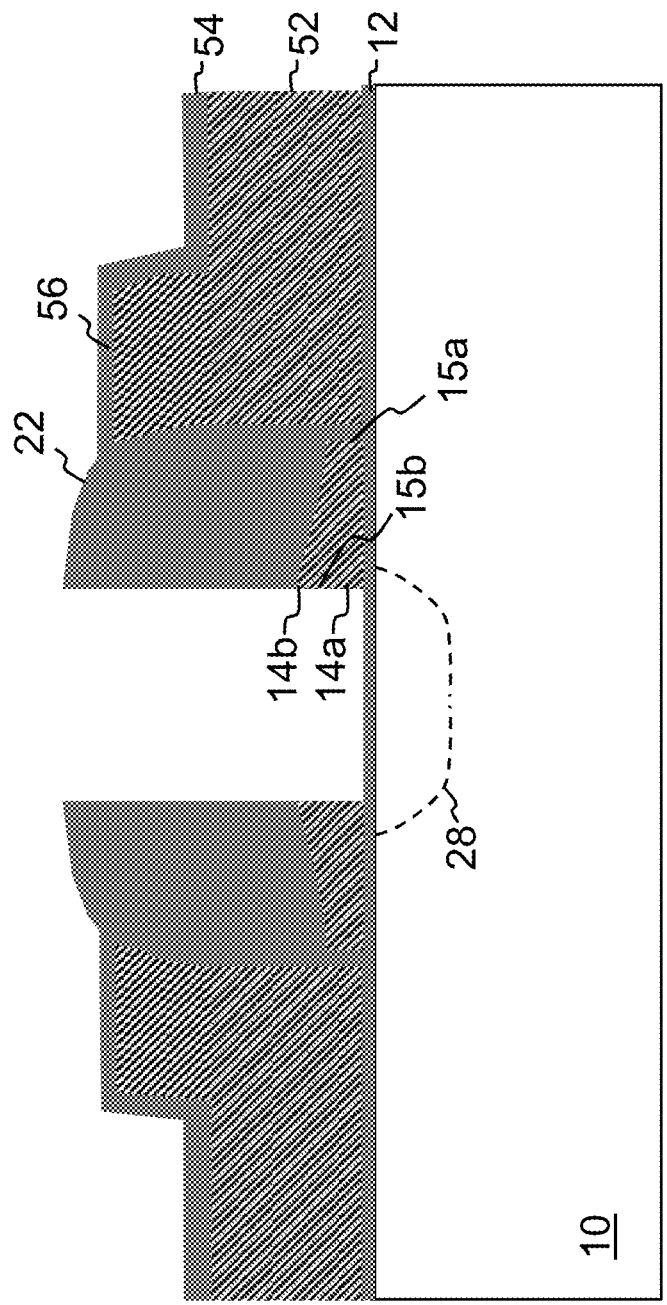

FIGS. 6A-6D illustrate another alternate embodiment for forming memory cells 36, which begins with the structure of FIG. 4A. A layer of polysilicon 52 is formed over the structure. An oxide layer 54 is formed on poly layer 52. A chemical mechanical polish is then used to remove portions of the oxide 54 and poly 52 that are over nitride block 20 and over oxide spacers 22, as shown in FIG. 6A. The structure is optionally oxidized to form an oxide layer 56 on the exposed top portions of poly layer 52, to protect poly layer 52 from the subsequent etch of poly layer 14 described below. If oxide layer 56 is omitted, the etch of poly layer 14 will result in top portions of poly layer 52 being removed, and therefore will result in shorter word line gates from poly layer 52. A nitride etch is performed to remove nitride block 20, leaving the portion of poly layer 14 between oxide spacers 22 exposed. A poly etch is then performed to remove that exposed portion of the poly layer 14, leaving distinct poly blocks 14a under the oxide spacers 22. An implant process follows for forming the source region 28 in the substrate 10 between the oxide spacers 22 and poly blocks 14a. An anneal can be performed at this point, or later on, which will cause the source region 28 to extend partially under the poly blocks 14a. The resulting structure is shown in FIG. 6B.

Figure 6C:
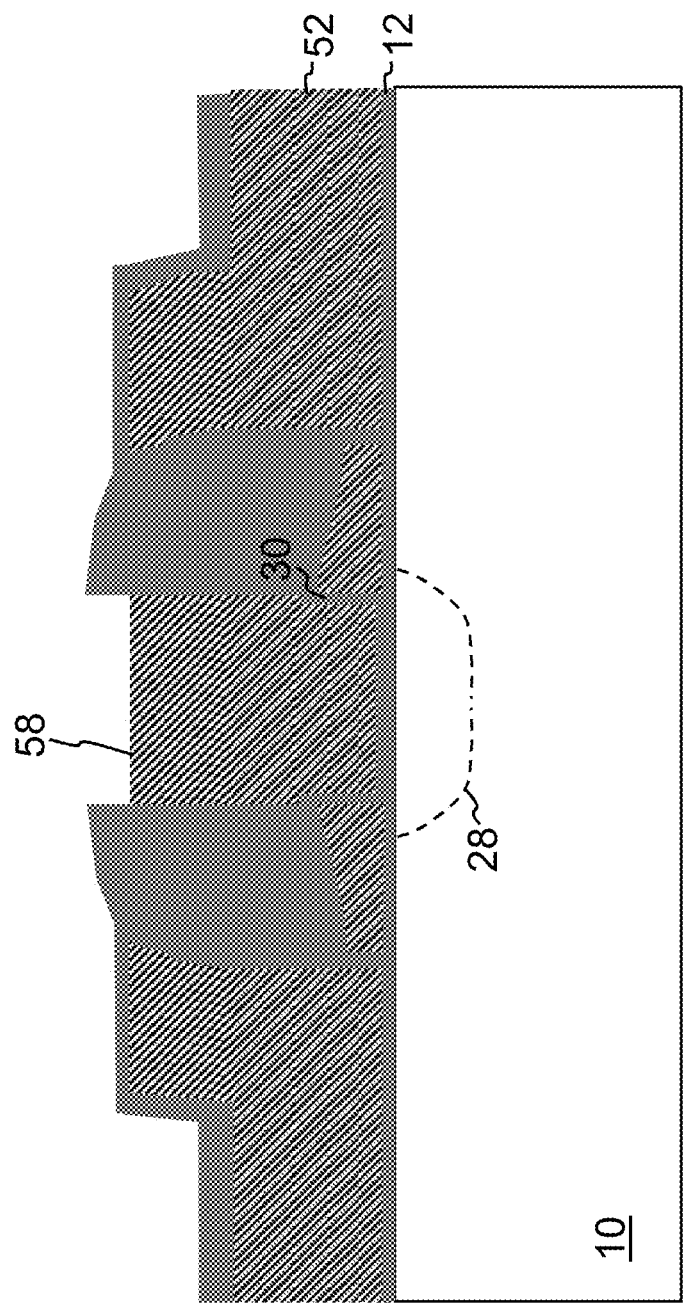
Figure 6D:
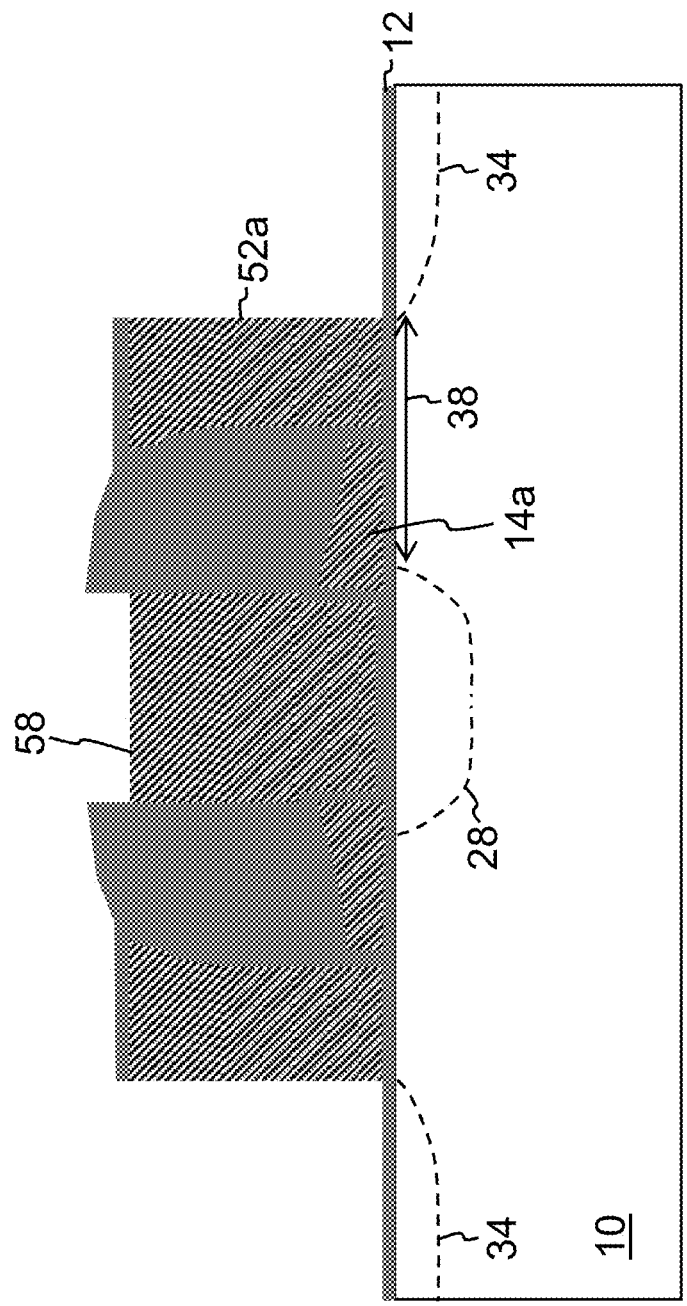

Oxide layer 30 is then deposited on the structure, including on the exposed ends of the poly blocks 14a adjacent the sharp edges 14b. A layer of polysilicon is then formed over the structure, followed by a poly etch that removes this polysilicon layer except for poly block 58 disposed between spacers 22, as shown in FIG. 6C. A masking step is performed to cover the poly block 58 and portions of poly layer 52 with photoresist, but leaving the rest of the structure exposed. Poly and oxide etches are performed to remove exposed portions of poly layer 52 and oxide layers 56/54, leaving poly blocks 52a as the remaining portions of poly layer 52 on the outer sides of spacers 22/24. After photoresist removal, an implantation is then performed to form the drain regions 34 in the substrate adjacent the poly blocks 52a. The final structure is shown in FIG. 6D.

Figure 7:
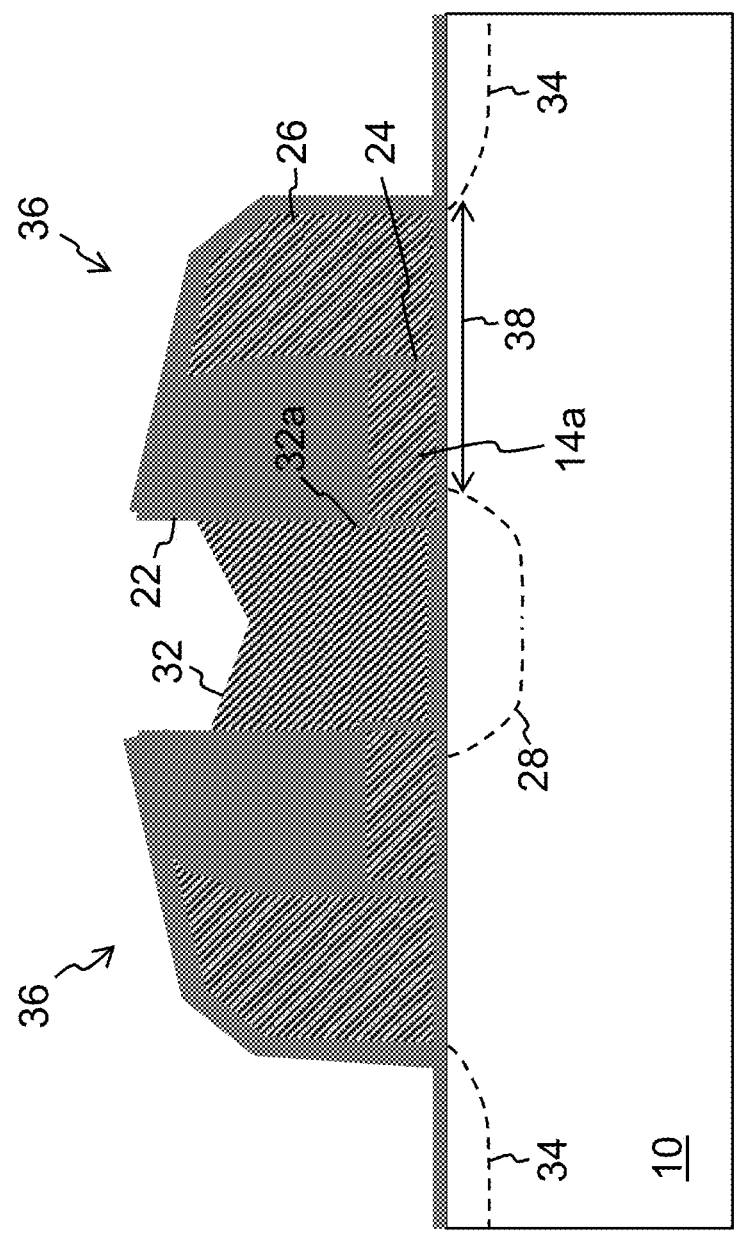
FIGS. 7-10 are side cross sectional views showing the memory cells of FIGS. 2E, 4D, 5C and 6D, respectively, with the floating gates having planar upper surfaces.
Figure 8:
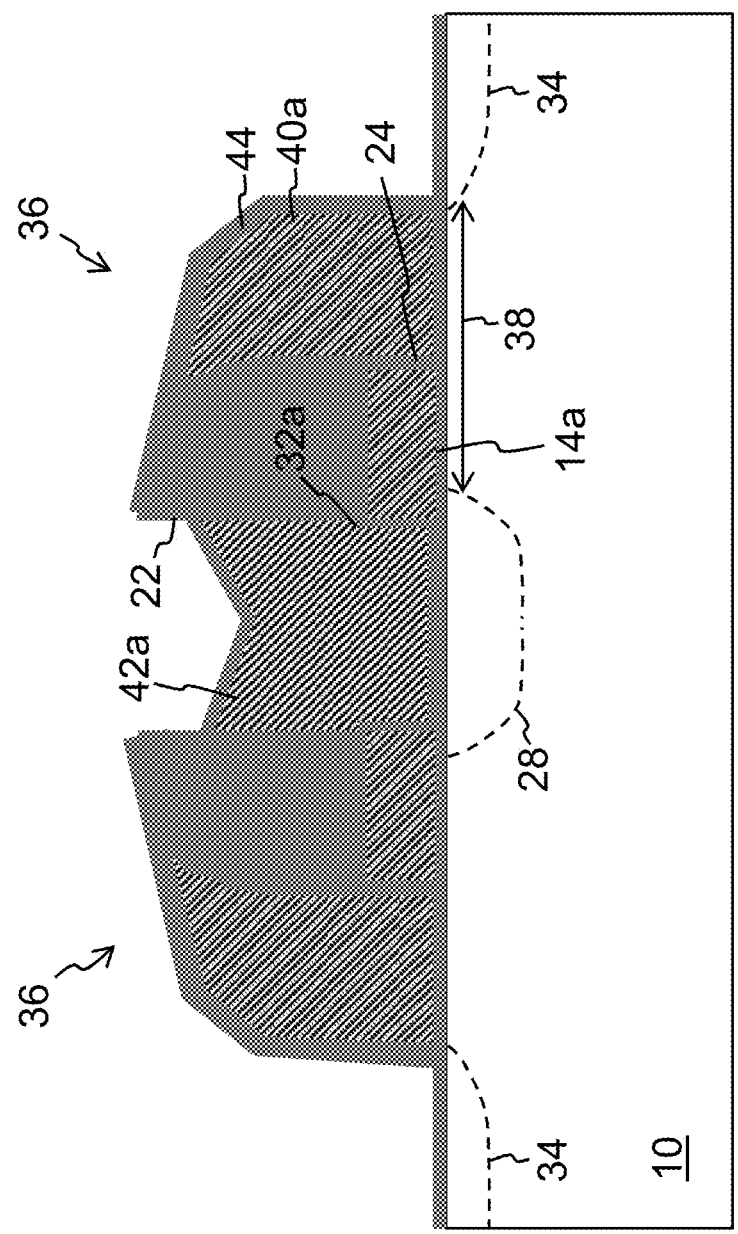
Figure 9:
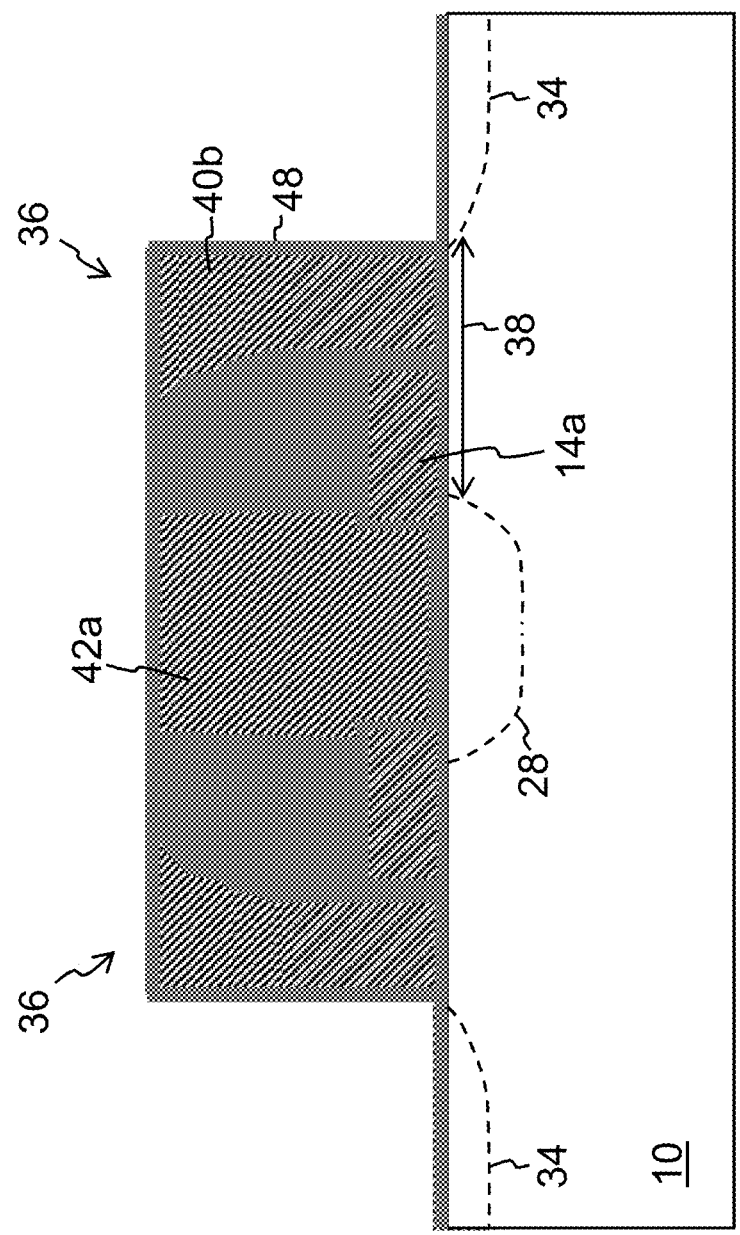
Figure 10:
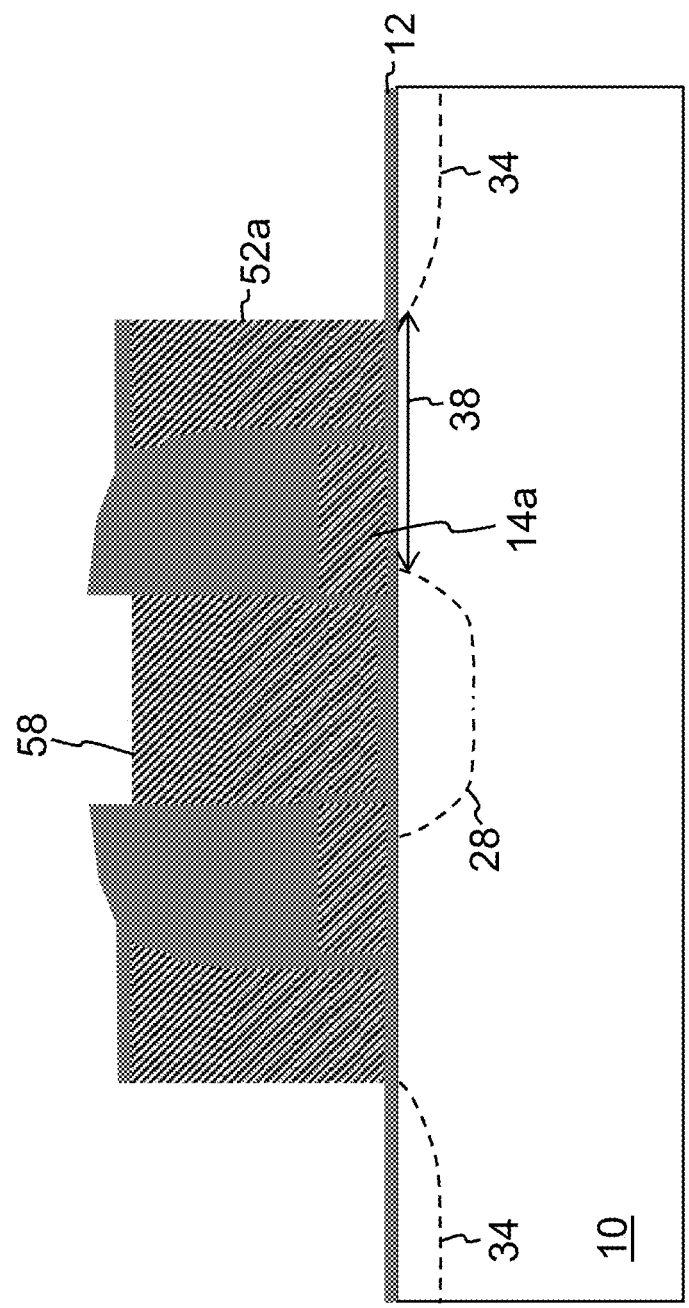

It should be noted that while the slope etch of the top surface of the floating gate 14a is preferable to enhance erase efficiency, the slope etch can be omitted if enhanced erase efficiency is not desired. For example, if the slope etch described above with respect to FIG. 2A is omitted, then the final memory cell structure shown in FIG. 2E would instead be that shown in FIG. 7, where floating gate 14a has a planar upper surface. Similarly, the final memory cell structure shown in FIG. 4D would instead be that shown in FIG. 8, the final memory cell structure shown in FIG. 5C would instead be that shown in FIG. 9, and the final memory cell structure shown in FIG. 6D would instead be that shown in FIG. 10.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, not all method steps need be performed in the exact order illustrated or claimed, but rather in any order that allows the proper formation of the non-volatile memory cells of the present invention. Single layers of material could be formed as multiple layers of such or similar materials, and vice versa. Lastly, the terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory device, comprising:
    forming a first polysilicon layer using a first polysilicon deposition over and insulated from a semiconductor substrate;
    forming an insulation spacer directly on the first polysilicon layer;
    removing some of the first polysilicon layer so as to leave a block of the first polysilicon layer under the insulation spacer, wherein the block of the first polysilicon layer has opposing first and second side surfaces;
    forming a source region in the substrate adjacent the first side surface;
    forming a second polysilicon layer using a second polysilicon deposition, different from the first polysilicon deposition, over the substrate;
    removing some of the second polysilicon layer so as to leave a block of the second polysilicon layer that is over and insulated from the substrate, and laterally adjacent to and insulated from the second side surface;
    forming a third polysilicon layer using a third polysilicon deposition, different from the first and second polysilicon depositions, over the substrate;
    removing some of the third polysilicon layer so as to leave a block of the third polysilicon layer that is over and insulated from the source region; and
    forming a drain region in the substrate adjacent to the block of the second polysilicon layer.

2. The method of claim 1, wherein the forming of the insulation spacer comprises:
    forming a block of insulation material on the first polysilicon layer;
    forming a layer of insulation material on the first polysilicon layer and on the block of insulation material;
    removing some of the layer of insulation material so as to leave the insulation spacer of the layer of insulation material disposed on the first polysilicon layer and abutting a side surface of the block of insulation material.

3. The method of claim 2, wherein the removing of some of the first polysilicon layer comprises:
    performing a first polysilicon etch to define the first side surface aligned with a first side of the insulation spacer;
    removing the block of insulation material after the first polysilicon etch;
    performing a second polysilicon etch after the removing of the block of insulation material to define the second side surface aligned with a second side of the insulation spacer.

4. The method of claim 2, further comprising:
    performing a polysilicon sloped etch on the first polysilicon layer such that a portion of an upper surface of the first polysilicon layer slopes upwardly as the portion of the upper surface approaches the block of insulation material;
    wherein the insulation spacer is formed on the portion of the upper surface that slopes upwardly.

5. The method of claim 4, wherein:
    the block of the first polysilicon layer includes the upwardly sloping upper surface which terminates in a sharp edge at the second side surface.

6. The method of claim 5, wherein the block of the third polysilicon layer includes a side surface having a notch that faces and is insulated from the sharp edge.

7. The method of claim 1, wherein the removing of some of the second polysilicon layer comprises a polysilicon etch to form the block of the second polysilicon layer which is a spacer of polysilicon.

8. The method of claim 7, further comprising:
    forming a layer of silicon dioxide along the second side surface before the forming of the third layer of polysilicon, wherein the block of the third layer of polysilicon is insulated from the block of the first layer of polysilicon by the layer of silicon dioxide.

9. The method of claim 1, wherein the removing of some of the second polysilicon layer and the removing of some of the third polysilicon layer comprise:
    performing a chemical mechanical polish to remove upper portions of the second polysilicon layer and the third polysilicon layer disposed over the insulation spacer;
    forming photoresist on a first portion of the second polysilicon layer adjacent the first side surface while leaving a second portion of the second polysilicon layer adjacent the first portion of the second polysilicon layer exposed by the photoresist; and
    performing a polysilicon etch to remove the second portion of the second polysilicon layer.

10. The method of claim 1, wherein the removing of some of the second polysilicon layer comprises:
    performing a chemical mechanical polish before the forming of the third polysilicon layer to remove an upper portion of the second polysilicon layer disposed over the insulation spacer;

forming photoresist on a first portion of the second polysilicon layer adjacent the first side surface while leaving a second portion of the second polysilicon layer adjacent the first portion of the second polysilicon layer exposed by the photoresist after the removing of some of the third polysilicon layer; and performing a polysilicon etch to remove the second portion of the second polysilicon layer.

11. A method of forming a memory device, comprising:

forming a first polysilicon layer using a first polysilicon deposition over and insulated from a semiconductor substrate;

forming an insulation spacer on the first polysilicon layer;

removing some of the first polysilicon layer so as to leave a block of the first polysilicon layer under the insulation spacer, wherein the block of the first polysilicon layer has opposing first and second side surfaces;

forming a source region in the substrate adjacent the first side surface;

forming a second polysilicon layer using a second polysilicon deposition over the substrate;

removing some of the second polysilicon layer so as to leave a block of the second polysilicon layer that is over and insulated from the substrate, and adjacent to and insulated from the second side surface;

forming a third polysilicon layer using a third polysilicon deposition over the substrate;

removing some of the third polysilicon layer so as to leave a block of the third polysilicon layer that is over and insulated from the source region; and forming a drain region in the substrate adjacent to the block of the second polysilicon layer;

wherein the removing of some of the second polysilicon layer comprises:

performing a first polysilicon etch to remove a first portion of the second polysilicon layer on a first side of the insulation spacer, wherein the first polysilicon etch is performed before the forming of the third layer of polysilicon; and performing a second polysilicon etch to remove a second portion of the second polysilicon layer on a second side of the insulation spacer opposite the first side of the insulation spacer, wherein the second polysilicon etch is performed after the forming of the third polysilicon layer.

12. The method of claim 11, wherein the block of the second polysilicon layer is a spacer of polysilicon.

* * * * *

UNITED STATES PATENT AND TRADEMARK OFFICE
CERTIFICATE OF CORRECTION

PATENT NO.        : 11,404,545 B2
APPLICATION NO.   : 16/796412
DATED             : August 2, 2022
INVENTOR(S)       : Chunming Wang et al.

Page 1 of 1

It is certified that error appears in the above-identified patent and that said Letters Patent is hereby corrected as shown below:

In the Specification

In Column 1, Lines 45-46, "first side surface" should read --second side surface--.
In Column 1, Line 52, "second side surface" should read --first side surface--.
In Column 7, Lines 53-54, "first side surface" should read --second side surface--.
In Column 7, Line 61, "second side surface" should read --first side surface--.
In Column 9, Lines 18-19, "first side surface" should read --second side surface--.
In Column 9, Line 25, "second side surface" should read --first side surface--.

Signed and Sealed this
Twenty-seventh Day of June, 2023

Katherine Kelly Vidal
*Director of the United States Patent and Trademark Office*